(12) United States Patent
Kothandaraman

(10) Patent No.: US 6,913,954 B2
(45) Date of Patent: Jul. 5, 2005

(54) PROGRAMMABLE FUSE DEVICE

(75) Inventor: Chandrasekharan Kothandaraman, Bogota, NJ (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/872,738

(22) Filed: Jun. 21, 2004

(65) Prior Publication Data

US 2004/0233768 A1 Nov. 25, 2004

Related U.S. Application Data

(62) Division of application No. 10/335,320, filed on Dec. 31, 2002.

(51) Int. Cl.⁷ ............................................... H01L 21/82
(52) U.S. Cl. .................... 438/132; 438/131; 438/215; 438/281; 438/333; 438/467; 438/601; 257/529; 257/530; 257/665
(58) Field of Search .......................... 438/2, 131, 132, 438/215, 281, 333, 467, 600, 601, 902, 957; 257/30, 173, 529, 530, 665, 910

(56) References Cited

U.S. PATENT DOCUMENTS

| | | | |
|---|---|---|---|
| 5,631,862 A | 5/1997 | Cutter et al. | |
| 5,706,238 A | 1/1998 | Cutter et al. | |
| 5,831,303 A | * 11/1998 | Rapeli | ........................ 257/316 |
| 5,978,248 A | * 11/1999 | Marr et al. | ..................... 365/96 |
| 6,008,099 A | * 12/1999 | Sultan et al. | ................ 438/305 |
| 6,087,677 A | 7/2000 | Wu | |
| 6,268,640 B1 | 7/2001 | Park et al. | |
| 6,452,248 B1 | * 9/2002 | Le | ............... 257/530 |
| 6,455,383 B1 | 9/2002 | Wu | |
| 6,458,631 B1 | 10/2002 | Brintzinger et al. | |
| 6,496,416 B1 | * 12/2002 | Look | ..................... 365/185.18 |
| 6,593,623 B1 | 7/2003 | Sultan | |
| 6,603,175 B2 | 8/2003 | Kadowaki et al. | |

OTHER PUBLICATIONS

Ewald, L., et al., "Fusible Link Device," IBM Technical Disclosure Bulletin, vol. 19, No. 8, Jan. 1977, pp. 3089–3090.

* cited by examiner

Primary Examiner—Andy Huynh
(74) Attorney, Agent, or Firm—Slater & Matsil, L.L.P.

(57) ABSTRACT

A fuse device including a transistor having a source, drain, and gate. The gate includes a first and second gate contact. A current may be run from the first gate contact to the second gate contact to heat the gate. The current through the gate indirectly heats the channel region beneath the gate, causing localized annealing of the channel region. The heated gate causes dopants to diffuse from the source and drain into the channel region, permanently changing the properties of the transistor material and programming the fuse device. The fuse device functions as a transistor in an unprogrammed state, and acts as a shunt in a programmed state, caused by the shorting of the source and drain of the transistor during programming.

18 Claims, 2 Drawing Sheets

PROGRAMMABLE FUSE DEVICE

This application is a divisional of patent application Ser. No. 10/335,320, entitled "Programmable Fuse Device," filed on Dec. 31, 2002, which application is incorporated herein by reference.

TECHNICAL FIELD

The present invention relates generally to electronic devices, and more particularly to a programmable fuse device and method of manufacturing thereof.

BACKGROUND

Fuses and antifuses are programmable electronic devices that are used in a variety of circuit applications. A fuse is normally closed, and when blown or programmed results in an "open" or increase in resistance. An antifuse is similar to a fuse in that it is programmable. However, an antifuse is normally open, having a capacitor-like structure. When an antifuse is blown or programmed, this results in a short, or decreased resistance.

There are many applications for fuses and antifuses. One particular application is for customizing integrated circuits (IC's) after production. One IC configuration may be used for multiple applications by programming the fuses and/or antifuses (e.g., by blowing or rupturing selected fuses and antifuses) to deactivate and select circuit paths. Thus, a single integrated circuit design may be economically manufactured and adapted for a variety of custom uses.

Fuses and antifuses may also be used to program chip identification (ID) after an integrated circuit is produced. A series of ones and zeros can be programmed in to identify the IC so that a user will know its programming and device characteristics, as examples.

Another exemplary application for fuses and antifuses is in memory devices, to improve yields using redundancy. By providing redundant memory cells on memory chips, the circuits or modules that are defective or not needed may be eliminated from circuit operation, thus improving the yield. This may be accomplished by programming fuses or antifuses to alter, disconnect or bypass active cells or circuits and allow redundant memory cells to be used in place of cells that are not functional. Similarly, information may be rerouted using fuses and/or antifuses.

Typically, fuses or fusible links are incorporated into an integrated circuit design, and then these fuses or fusible links are selectively programmed, e.g., blown or ruptured, by passing an electrical current of sufficient magnitude through the selected fuses to cause them to melt and break the connection. A common design for a fuse circuit is shown in FIG. 1. A prior art fuse 12 include two terminals 14 and 16, typically with one terminal 14 being larger than the other 16, as shown. The fuse 12 includes a necked section or link 15 disposed between the two terminals 14 and 16. The fuse 12 may comprise silicided polysilicon, other semiconductors, or metal, as examples. When a predetermined amount of current is applied between the terminals 14 and 16, the link 15 is severed or altered, such that the fuse 12 is an "open" or is changed (e.g., increased) in resistance.

A preferred mechanism for programming the fuse is to alter the fuse by electromigration rather than actual rupturing of the fuse. Electromigration occurs when a current of sufficient magnitude flows through the fuse material. Current flows in a first direction, and electrons flow in a second direction opposite from the first direction. The electrons push some of the fuse conductive material towards the second direction of the electron flow. This results in the changing of the resistance of the fuse link without completely breaking it apart; rather, electromigration results in an increase in the resistivity of the material comprising the fuse. Programming a fuse using electromigration is typically more controllable and reliable than severing a fuse link.

A fuse 12 that has been programmed or altered by electromigration is shown in FIG. 2. To program the fuse 12, a voltage is applied between terminals 14 and 16 to cause a current to flow from terminal 16 to terminal 14 (thus causing electrons to flow from terminal 14 to terminal 16). The fuse 12 exhibits increased resistance after being programmed, because portions of the link 15 and terminal 14 have been destroyed, e.g., some material is missing from the left side of the fuse link 15, and because a portion of the fuse link 15 material has been pushed from terminal 14 to terminal 16, in the direction of electron flow. While the nature of the fuse link 15 has been changed, the outline of the fuse 12 remains substantially intact after programming. The fuse 12 still has the same length and width after it is programmed, for example. Note that the terminals 14 and 16 include a plurality of contacts 24 and 26 disposed thereon.

Referring again to the prior art schematic shown in FIG. 1, a prior art two terminal fuse 12 is typically utilized in a circuit 10 by coupling one terminal 14 of the fuse 12 to a field effect transistor (FET) 18 having a gate, source and drain, and by coupling the other terminal 16 of the fuse 12 to a programming voltage $V_P$. The terminal 14 may be coupled to the FET 18 drain. The gate of the FET 18 is coupled to a select circuit 20, which is coupled to a clock signal CLK. The source of the FET 18 is coupled to a reference voltage or ground GND, as shown.

Typically, a large number of fuses 12 are used in a circuit (not shown), each having its own FET 18. The select circuit 20 is adapted to select and program the fuse 12 that is desired to be read or programmed. The information regarding the state of the fuse (open or closed) is stored in a latch 22 that is coupled to the terminal 14. The INPUT and NEXT signals are used to form a chain of fuses 12. In such a configuration the NEXT signal of one latch connects to the input of the next latch. The latch 22 may include sense circuitry to sense the state of the fuse 12, not shown.

The FET 18 is used to change the resistance of the fuse 12 by allowing causing current to flow through the fuse 12 when the FET 18 is selected. Information read from the fuse 12 is stored in the latch 22. For example, to program the fuse 12, when the correct clock CLK is received by the select circuit 20 and when a "1" is stored in the latch 22, indicating that the fuse 12 has been selected to be programmed or changed, then the FET 18 is turned on. When the FET 18 is turned on, due to the programming voltage $V_P$ applied to terminal 16 a current passes through the fuse 12 from terminal 16 to terminal 14. The current changes the resistance of the fuse 12 by changing the nature of the material that comprises the fuse 12. As described above, this change may comprise rupturing the link 15 or altering the link 15 and/or terminals 14 and 16 to change the resistance of the fuse 12. The initial resistance of the fuse 12 prior to programming may be around 100 ohms, and after programming, the resistance of the fuse 12 may range from 1000–10,000 ohms, as examples.

A disadvantage of the circuit 10 shown in FIG. 1 is that a large amount of current and/or voltage is required to alter the state of the prior art fuse 12. For example, 10 mA or more of current and a voltage of about 2.5 V between terminal 16 and ground may be required to program the fuse 12. Thus, there is a need in the art for a fuse design that can be programmed at lower voltage and current levels. Also, prior art fuse transistors must be relatively large to accommodate the current and hence the circuits occupy a large chip area. Thus, there is a need in the art for fuse devices requiring smaller programming currents that would result in smaller chip areas.

SUMMARY OF THE INVENTION

These and other problems are generally solved or circumvented, and technical advantages are generally achieved, by preferred embodiments of the present invention, which include a fuse device comprising a transistor having characteristics that are changed upon programming.

In accordance with a preferred embodiment of the present invention, an electronic device includes a transistor, the transistor including a source, drain and gate. The source and drain comprise semiconductor material heavily doped with a first dopant. The gate includes a first end and a second end. A first gate contact is coupled to the gate first end, and a second gate contact is coupled to the gate second end. A current generating circuit is coupled to the first gate at a first output, and is coupled to the second gate contact at a second output.

In accordance with another preferred embodiment of the present invention, a programmable electronic device includes a workpiece, a source region formed within the workpiece, the source region being doped with a first dopant material, and drain region formed within the workpiece, the drain region being doped with the first dopant material. A gate dielectric is formed over a channel region that is adjacent the source region and drain region, and a gate is disposed over the gate dielectric, the gate including a first contact at a first end and a second contact at a second end that is opposed to the first end. A first supply node is coupled to the first end of the gate, the first supply node carrying a first voltage potential. A second supply node is coupled to the second end of the gate, the second supply node carrying a second voltage potential different from the first voltage potential during a programming mode.

In accordance with yet another preferred embodiment of the present invention, a method of manufacturing a programmable electronic device includes providing a transistor, the transistor including a source, drain and gate, the gate having a first end and second end opposing the first end, the source and drain comprising semiconductor material heavily doped with a first dopant within a workpiece. The method includes coupling a first gate contact to the first end of the gate, and coupling a second gate contact to the second end of the gate, wherein the fuse is programmable by passing a current from the first gate contact through the gate to the second gate contact, wherein the current heats the gate. The heated gate proximate the source and drain causes outdiffusion of the first dopant from the source and drain into the workpiece proximate the gate, shorting the source and drain.

Another embodiment of the invention is a method of programming a electronic device comprising a transistor, the transistor including a source, drain and gate, the gate having a first and second end, the gate being disposed over the source and drain, and the source and drain comprising semiconductor material heavily doped with a first dopant within a workpiece. The method includes causing a current to flow from the first end of the gate to the second end of the gate, wherein the current heats the gate, causing a change in the characteristics of the transistor.

Advantages of preferred embodiments of the present invention include providing a programmable electronic device that requires a small amount of current to program it or change its programming state. The electronic fuse device is indirectly programmable, rather than needing to be directly programmed. More particularly, the electrical characteristics of the component that is heated, the gate, are not substantially altered. Rather, the gate is heated, and the gate heat locally anneals the channel region beneath the gate, causing dopants from the source and drain to move into the channel region and electrically couple together the source and drain. The fuse device may include four or more contacts, for example.

Because a lower amount of current and voltage are required to program embodiments of the programmable fuse device, the programmable fuse device and its accompanying circuits may be designed to occupy a smaller amount of chip area. The reduced chip area results in improved yields, because the statistical probability of defects is lower for a smaller area circuit. The programmable fuse device may be implemented in low power circuits and other applications that run at lower voltages, such as wireless circuits, because the fuse device may be programmed at a low current and low voltage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a programmable fuse device comprising a transistor having characteristics that are changed upon programming. Embodiments of the invention also include a method of manufacturing and programming the fuse, as examples.

Figure 3:
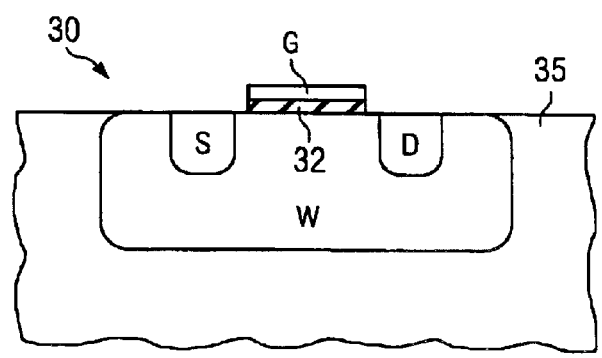
FIG. 3 is a cross-sectional view of a programmable fuse device including a transistor in accordance with an embodiment of the invention.

With reference now to FIG. 3, a cross-sectional view of a fuse device 30 in accordance with an embodiment of the present invention is shown. The fuse device 30 comprises a transistor having characteristics that are changed upon programming. The transistor preferably comprises a FET including a source S, drain D, and a gate G disposed above the source S and drain D. The gate G preferably comprises polysilicon or materials such as conductors or other semiconductors, for example. The source S and drain D preferably comprise regions of heavily doped semiconductor material that have been created, for example, by ion implantation or diffusion, directly within a workpiece or substrate 35, if the transistor comprises an NFET. The source S and/or drain D may further comprise heavily doped extensions and halos formed in the workpiece 35 or well region W (not shown). In a preferred embodiment, the source S and drain D comprise regions of heavily doped semiconductor material formed within an optional lightly doped well region W that is formed in a workpiece 35, e.g., when the transistor comprises a PFET.

The source S and drain D may comprise doped crystalline silicon or other semiconductor material, for example. The gate G is separated from the well region W by a gate dielectric 32 comprising an oxide or other insulating material. The gate dielectric 32 may be around 50 Å thick, as an example, and alternatively, the gate dielectric may comprise a thickness of 5 Å to 100 Å, for example. The well region W may comprise doped semiconductor material formed within a workpiece 35 comprising semiconductor material, as shown. The workpiece 35 may include a semiconductor substrate comprising silicon or other semiconductor materials covered by an insulating layer, for example. The workpiece 35 may also include other active components or circuits, not shown. The workpiece 35 may include other conductive layers or other semiconductor elements, e.g. transistors, diodes, etc. Compound semiconductors such as GaAs, InP, Si/Ge, SiC, as examples, may be used in place of silicon. The workpiece 35 is also referred to herein as a substrate, for example.

Figure 4:
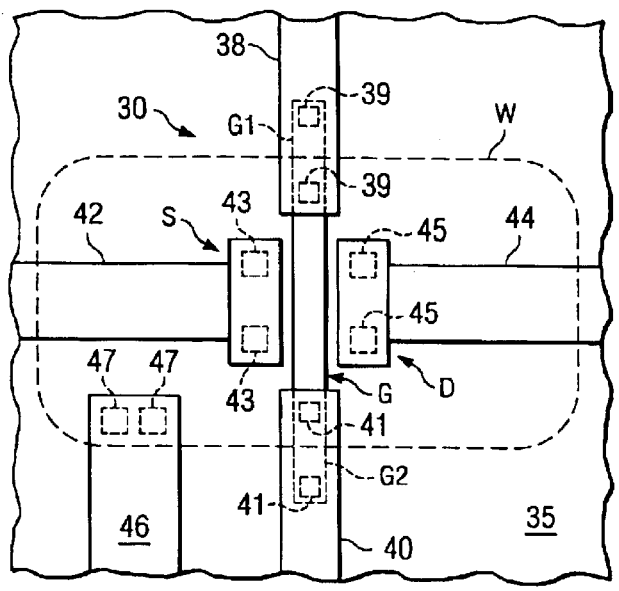
FIG. 4 is a top view of the fuse device having two gate contacts.

FIG. 4 shows a top view of an embodiment of the fuse device 30. The fuse device 30 preferably has at least four points of contact: the source S, the drain D, and a gate G having two points of contact. More preferably, the fuse includes five terminals or contacts: a source contact 42 coupled to the source S, a drain contact 44 coupled to the drain D, a substrate contact 46 coupled to the substrate or well region W (as shown by the dashed line), and a first gate contact 38 and a second gate contact 40 which are coupled to a first end G1 and a second end G2 of the gate G, respectively. The source contact 42 may be disposed in a metallization layer above the source S, and the source contact 42 may be coupled to the source S by one or more vias 43. The vias 43 may comprise copper, tungsten, or other metals or conductive materials, as examples, and the vias 43 may reside in an insulating layer disposed between the metallization layer and the source S. Similarly, one or more vias 45 couple the drain to contact 44; one or more vias 39 couple the gate contact 38 to the gate first end G1; one or more vias 41 couple the gate contact 40 to gate first end G2; and one or more vias 47 couple the well W to contact 46, as shown.

The substrate contact 46 is also referred to herein as a body contact 46. If the device 30 includes the optional well W, the contact 46 is preferably coupled to the well W. The substrate or well region W of the transistor is preferably coupled to a reference voltage $V^{REF}$ (see FIG. 6), which may comprise a ground voltage, zero volts or other reference voltage, for example.

Referring again to FIG. 4, in accordance with embodiments of the invention, advantageously, the gate G is coupled to two gate contacts, a first gate contact 38 and a second gate contact 40. The gate G comprises a first end G1, a second end G2 and a region of conductive material disposed therebetween. The gate first end G1 is opposed to the gate second end G2. The first end G1, second end G2 and region of conductive material are preferably integral and comprise one piece. The two contacts 38 and 40 of the gate G allow the transistor of the fuse device 30 to be programmed, to be described further herein. Preferably, the first and second gate contacts 38 and 40 comprise a metal such as aluminum, copper, or other conductive materials, as examples.

The source S is coupled to a source contact 42 disposed in a subsequently deposited layer above the source S. Similarly, the drain D is coupled to a drain contact 44 disposed in a subsequently deposited layer above the drain D. The substrate or well region W is coupled to a substrate or body contact 46 that may be disposed above the well W at the side of the transistor, as shown, for example. Alternatively, the source contact 42, drain contact 44 and substrate contact 46 may be located elsewhere, such as in underlying layers, for example. The substrate contact 46 may comprise a large common contact that is coupled to an array of fuses 30, to be described further herein.

In an unprogrammed state, the source S of the fuse device 30 is electrically separated from the drain D of the fuse device 30 by a portion of the well region W (or substrate, if there is no well region W, not shown), also referred to as a channel region, as shown in FIG. 3. To program the fuse device 30, a current is passed between the two gate contacts 38 and 40. Driving a current through the gate G changes the characteristics of the FET. More particularly, applying a current between the gate contacts 38 and 40 heats the material of the gate G. The heat from the gate G heats channel region within the well region W or substrate region beneath the gate G, causing dopants to diffuse out of the source S and drain D. The gate G acts as a heater to locally anneal the underlying channel region, causing outdiffusion of dopants from the heavily doped source S and drain D regions. In a preferred embodiment, at least a portion of the dopants outdiffused into the channel region diffuse from extensions and/or halos of the source S and drain D regions.

Figure 5:
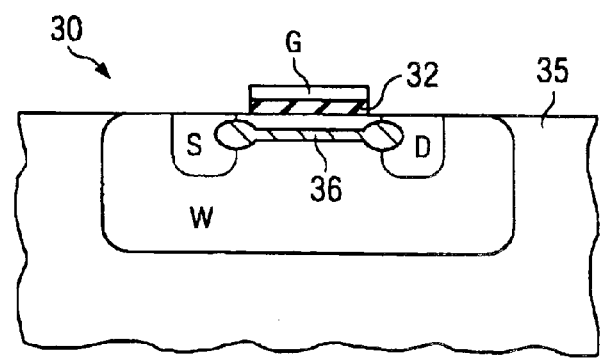
FIG. 5 is a cross-sectional view of the fuse device after it has been programmed.

FIG. 5 shows a cross-sectional view of a programmed fuse device 30. A conductive region 36 is formed within the well region W after passing a current along the gate G. The large amount of heat generated on the gate G heats the transistor channel region between the source S and drain D, joining the source S and drain D together electrically. When the gate G is heated, the dopants within the source S and drain D move and migrate or diffuse out of the source S and drain D, into the channel region between the source S and drain D, in response to the extreme heat. The temperature of the channel region during the programming of the fuse device 30 is preferably less than the melting point of the substrate 35 or well region W material, and the channel region temperature preferably reaches between about 800 to 1000° C., for example. The dopants that migrate into the channel region form the conductive region 36 below the gate G between the source S and drain D. Thus, the channel region of the substrate 35 or well W below the gate G is altered during programming. The heating of the gate G causes the channel regions to be heated to a high temperature, preferably for a relatively short period of time, e.g., a few microseconds to a few milliseconds, and the outdiffused dopants create a short between the source S and the drain D.

Preferably, the FET of the fuse device 30 comprises a PFET, and an impurity such as boron is used to dope the source S and drain D. Boron atoms move easily due to the application of heat. In this embodiment, the source S and drain D are p+ type and the well region W comprises an n well on a substrate 35. For example, the source S and drain D may be doped with boron, and the well region W may be doped with arsenic or phosphorous. Preferably, the source and drain are heavily doped and the well region is lightly doped. When the gate G is heated, the impurities (such as the boron atoms in this case) move out of the source S and out of the drain D into the channel region, e.g., the well region W immediately below the gate G. The boron atoms compensate the n-type dopant atoms in the heated region 36. The continuous presence of the boron atoms from the source to the drain creates a low resistance path between the source and the drain of the transistor, represented by conductive region 36. The n-type dopants, e.g., arsenic or phosphorous, may remain in the channel region and in the less heated regions of the well W, for example, but are electrically compensated by the boron atoms diffusing out of the source and drain regions. The bulk of the substrate 35 and the region of the well W farther away from the gate remain unaffected by the localized heating of the channel region.

Although n type dopants such as arsenic and phosphorus move less easily than boron, in an alternative embodiment, the FET of the fuse device 30 comprises an NFET, wherein the source and drain are n+ type and the substrate 34 is doped with p type material. More particularly, the source S and drain D are n+ type, there is no well region W, and the substrate 35 is lightly doped with p type dopants. For example, the source S and drain D may be doped with arsenic or phosphorous, and the substrate 35 may be doped with boron. Preferably, the source S and drain D are heavily doped. When the gate G is heated, the impurities (such as the arsenic or phosphorous atoms in this case) move out of the source S and out of the drain D into the channel region of the substrate 35. The arsenic or phosphorous atoms compensate the p type atoms in the heated region 36, and create a continuous low resistance path, represented by conductive region 36. The conductive region 36, in this example, comprises arsenic or phosphorous-doped silicon. The substrate and regions of the well farther away from the channel are left undisturbed.

Before programming, the FET of the fuse device 30 functions as an ordinary FET. In the unprogrammed programming state, when a voltage is applied to the gate G, current flows from the source S to the drain D. Only when the gate G is turned on or has an appropriate amount of voltage applied will a substantial amount of current flow from the source S to the drain D.

However, in the programmed state shown in FIG. 5, the source S and drain D are shorted by conductive region 36. Even with an "off" voltage applied to the gate of the FET of the fuse device 30 (e.g., when 0 volts is applied to the gate contact, for an NFET, or when a supply voltage is applied to the gate contact, for a PFET), a current flows from the source S to the drain D.

In an alternate embodiment, the out-diffusion of the dopants does not form a continuous path from the source to the drain, but merely changes the characteristics of the FET. In this case, after programming, the FET has an altered threshold voltage (e.g., the minimum voltage needed to turn on the FET), which can be sensed by appropriate sense circuitry.

In accordance with embodiments of the invention, the fuse device 30 will be programmed when a voltage potential is applied across both gate terminals 38 and 40, and a significant amount of current is allowed to pass through the gate G. For example, about 1 mA of current should flow between the two terminals 38 and 40 of the gate G in order to program the fuse device 30.

More particularly, in the normal operation (e.g., prior to programming) of the FET fuse device 30, one side of the gate (e.g., G1 or G2) is preferably floated or not coupled to a voltage potential. Normally, no current is passed through the gate G; rather, a potential is applied to the gate G. For example, contact 40 coupled to gate second end G2 may be allowed to float, and a voltage of 1.5 V may be applied to contact 38 coupled to the gate first end G1. Alternatively, contact 38 may be allowed to float, and a voltage may be applied to contact 40. Thus, no significant amount of current flows between gate contact 38 (gate first end G1) and gate contact 40 (gate second end G2). Rather, the gate first and second ends G1 and G2 are at the same voltage potential. Another alternative is to apply 1.5 V to both gate contacts 38 and 40, for example. Only when there is a voltage difference between the gate first and second ends G1 and G2 (e.g., via gate contact 38 and 40) will the fuse device 30 be programmed.

Typically, to operate a FET such as the FET of the fuse device 30, a voltage potential is applied to the gate G, a voltage potential is applied to the drain D, and the source S is placed at a ground or a reference voltage (or the source is grounded and a voltage is applied to the drain, depending on the design configuration). For a PFET, the polarities are reversed, i.e., with zero voltage potential applied to the gate, the drain grounded and the source with a positive voltage current will flow from the source to the drain, (e.g. holes will flow from the source to the drain).

Table 1 shows the normal operation of the FET (PFET) of the fuse device 30 before the fuse device 30 is programmed.

TABLE 1

| | Voltage applied |
|---|---|
| Well (contact 46) | 0 V |
| Source (contact 42) | 1.5 V |
| Drain (contact 44) | 0 V |
| Gate (contact 38 and 40) | 0 V |

Applying these voltages causes current to flow from the source S to the drain D. No significant amount of current passes through the gate G because both gate contacts 38 and 40 are at 0 V at this point.

The following is an exemplary description of a method of programming the fuse device 30. To program the fuse device 30, a first voltage, e.g., 1.5 V is applied to gate contact 38, and a second voltage, the second voltage being different from the first voltage, e.g., 0 V is applied to gate contact 40. The other contact voltages are set at 0 V, as shown in Table 2:

TABLE 2

|  | Voltage applied |
| --- | --- |
| Well (contact 46) | 0 V |
| Source (contact 42) | 0 V |
| Drain (contact 44) | 0 V |
| Gate - G1 contact (contact 38) | 1.5 V |
| Gate - G2 contact (contact 40) | 0 V |

Applying a potential difference of 1.5 V at gate contact 38 and 0 V at gate contact 40 causes a current path between the first and second ends G1 and G2 of the gate G. The current causes heat generation along the gate G. The gate G may be about 0.1 μm wide and about 1 μm long, as an example. Current flows from gate contact 38 to the gate first end G1, along conductive material 39 to gate second end G2, to gate contact 40. The amount of current require to program the device 30 is in the order of 1–2 mA or less, for example. The current through the gate G heats the gate G and causes the source S and drain D to become electrically connected, because of the outdiffusion of the source and drain dopant material into the channel region. The shorting of the source S and drain D caused by the movement of the dopants into the channel region leaves the FET of the fuse device 30 in a permanently altered state. Now, if there is a potential difference between the source S and the drain D of the FET, current will flow from the source S to the drain D regardless of the voltage applied to the gate.

Therefore, in the unprogrammed state, when there is voltage applied to the gate G ('off-state' for the case of a PFET), and when there is a potential difference between the drain D and source S, there will be no current flow between the drain D and source S. Only when there is zero voltage applied to the gate G ('on-state' for a PFET), will there be a current flow from source S to drain D. Thus in the unprogrammed state, the fuse device 30 functions electrically as a normal PFET.

However, when the source S and drain D are shorted, the transistor fuse device 30 no longer functions as a FET. Rather, it functions like a shunt. In the programmed state, even when there is voltage applied to the gate G (PFET 'off-state'), upon the application of a voltage potential between the source S and drain D, current will flow from the source S to the drain D.

The programming state of the fuse device 30 may be determined electrically by applying an off-state voltage to the gate G (e.g., 0 V for PFET, 1.5 V for NFET), applying a voltage potential difference to the source S and drain D, and sensing whether or not current flows from the source S to the drain D. If current flows above the leakage level of the FET, the device 30 has been programmed. If current flow is below the leakage level with the gate G at the 'off-state' voltage, the device 30 has not been programmed. Typically the leakage currents are well below the nano-ampere range, while in the programmed state the current flow will be in the order of milliamperes, allowing the sense circuit to determine the programming state accurately.

A system or integrated circuit using the fuse device 30 may be configured such that a programmed device 30 represents a logic "1" and an unprogrammed fuse device 30 represents a logic "0," for example. In an alternative configuration, an unprogrammed fuse device 30 may represent a logic "1" and a programmed device 30 may represent a logic "0".

The fuse device 30 according to embodiments of the present invention can only be programmed once. Once the fuse device 30 is programmed, it cannot be changed back: the programming is irreversible. The properties of the channel of the FET of the fuse device 30 are permanently altered due to the heating of the gate G which causes movement of dopants into the channel region of the FET.

Figure 1:
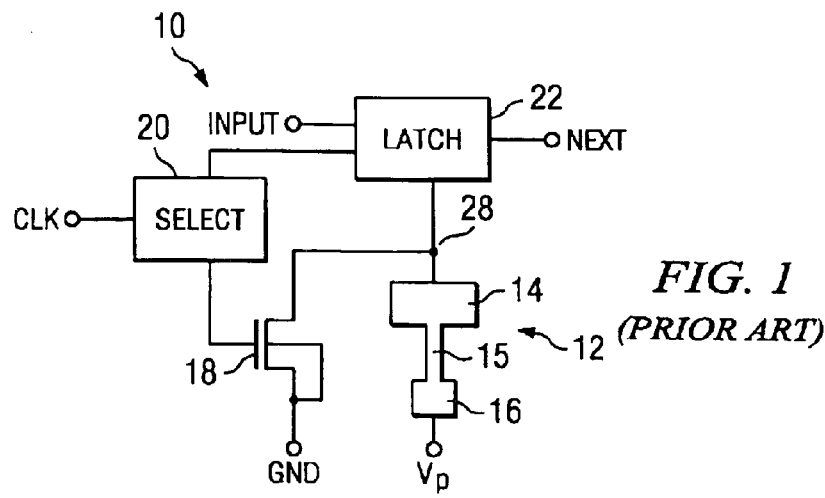
FIG. 1 shows a schematic of a prior art two terminal fuse and circuit for programming and sensing the fuse.
Figure 2:
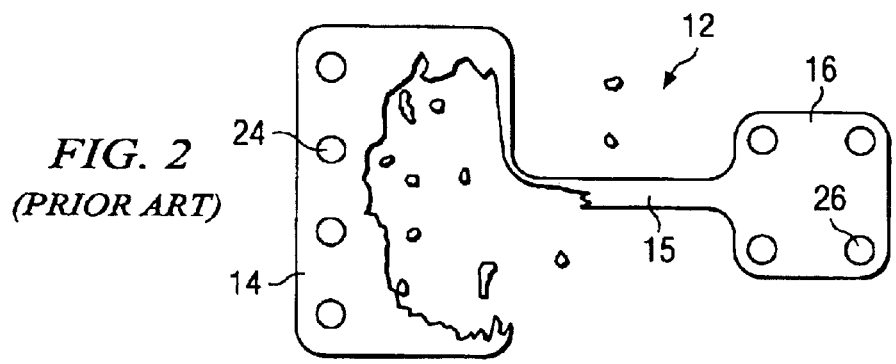
FIG. 2 shows a top view of the fuse of FIG. 1 after programming.
Figure 6:
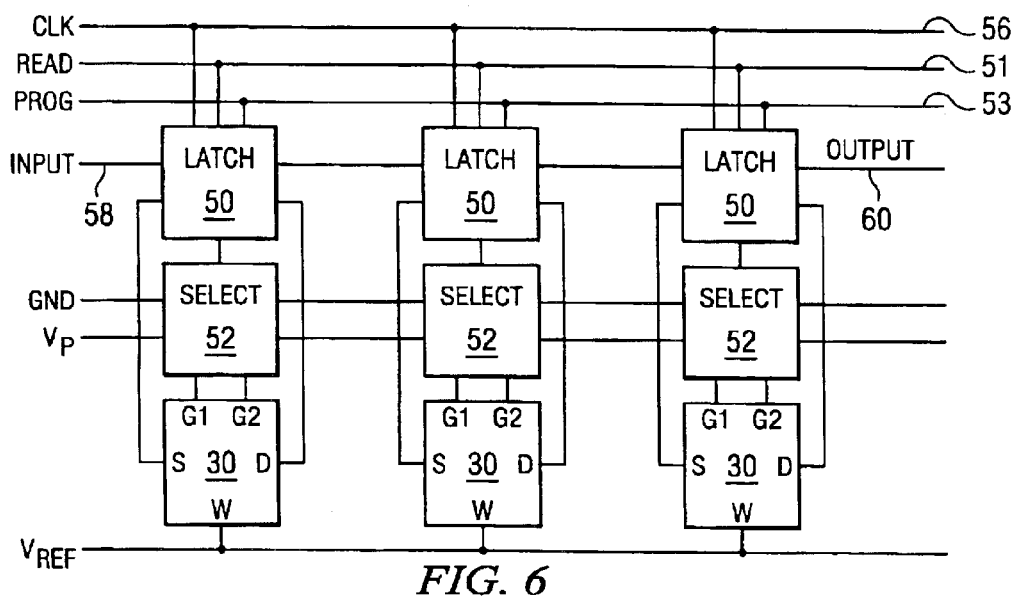
FIG. 6 is a block diagram showing an array of fuse devices that are selectable and programmable.

An example of an application of the fuse device 30 will next be described. FIG. 6 shows an array of fuse devices 30. The fuse devices 30 may be used in a manner similar to the prior art fuse 12 (FIG. 1), although there are additional terminals that must be utilized, because in a preferred embodiment, the fuse device 30 comprises three or more contacts, and more preferably comprises five contacts.

Using the fuse device 30 in an array is similar to using an array of two terminal fuses. A fuse device 30 is selected by select circuit 52, in conjunction with a latch 50. The PROG signal 53 determines whether the selected fuse 30 is to be programmed. When the PROG signal 53 is high and the corresponding latch 50 holds a '1', a potential difference is applied across the G1 and G2 terminals of the selected fuse 30. Similarly, when the READ signal 51 is enabled, there is no potential difference between G1 and G2 and hence no current flows through the gate.

FIG. 6 is exemplary of one way of utilizing the fuse device 30 described herein. Alternatively, there are many different ways of implementing and utilizing the fuse device 30. For example, if there are defects in an array of devices, the defective devices in the array may be effectively deselected by rewiring the semiconductor array using programmable fuse devices 30.

In another exemplary application, a plurality of fuses 30 may be used to represent a series of bits, such as a chip ID. A bit stream that represents a particular number or piece of information is coded into the appropriate binary form. This 'bit-string' is loaded into the latches 50 using the INPUT 58 and appropriate sequence of CLK 56 pulses. The fuse devices 30 are programmed sequentially or simultaneously through the application of PROG signal 53. To read the ID information, all the latches are preloaded with a logic state and then the READ signal 51 is used. Depending on whether the fuse 30 is programmed or unprogrammed, the application of the READ signal 51 will change or leave untouched the state of the latch 30. Finally, the information is scanned out of the OUTPUT signal 60.

Figure 7:
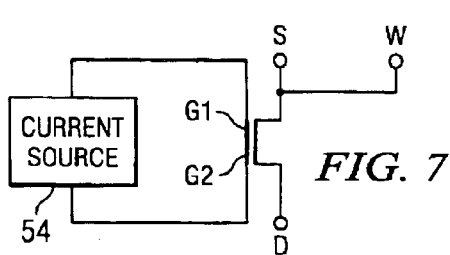
FIG. 7 is a schematic diagram of the fuse device in an unprogrammed state.
Figure 8:
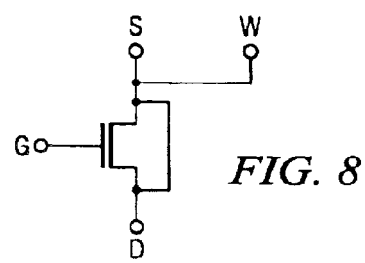
FIG. 8 shows a schematic diagram of the fuse device in a programmed state.

FIG. 7 shows a schematic diagram of the fuse device in an unprogrammed state, functioning as an ordinary FET. FIG. 7 includes a current source 54 that may be coupled to the gate ends G1 and G2 in accordance with embodiments of the present invention. The current source 54 preferably comprises a current generating circuit having a first output and a second output. The first output may be coupled to gate end G1 and the second output may be coupled to gate end G2, for example. The current source 54 supplies the current that heats the gate G1 and G2. FIG. 8 shows a schematic diagram of the fuse device in a programmed state, where the source S and drain D are electrically shorted or fused together.

In an embodiment of the invention, the source S and drain D may also include extension or implants. The sources and drain may also include halos, which are typically implanted at an angle to the wafer surface. When the source S and drain D comprise extensions and/or halos, preferably a majority of the dopants from the extensions and/or halos move into the channel region in response to the gate G1 and G2 heating to either form a continuous conductive region 36 or change the threshold voltage because of their redistribution.

The programmable fuse device 30 may be programmed by a current source 54 coupled to the first and second ends G1 and G2 of the gate, as shown in FIG. 7. Alternatively, the programmable fuse device may be programmed by a voltage source coupled across the first and second ends G1 and G2 of the gate (not shown). For example, a first supply node may be coupled to the first end G1 of the gate, the first supply node carrying a first voltage potential. A second supply node may be coupled to the second end G2 of the gate, the second supply node carrying a second voltage potential, the second voltage potential being different from the first voltage potential during a programming mode.

Embodiments of the present invention include a novel programmable fuse device and method of manufacture thereof. Another embodiment of the present invention comprises a method of programming a fuse device comprising a transistor. The fuse device transistor including a source, drain and gate. The programming method includes causing a current to flow from the first end of the gate to the second end of the gate, wherein the current heats the gate, causing the source to be permanently electrically coupled to the drain.

There are many technical advantages provided by the programmable fuse device 30 and programming method described herein. The fuse device 30 is easier to program than prior art two-terminal fuses. In a two terminal device, a current is applied that directly changes the resistance or breaks of the conductive material of the fuse, which requires a lot of current, e.g., 10 mA or more. With the present fuse device 30, the component being heated, e.g., the gate G, is not the component that is altered. Rather, the gate heat induces a material change in the adjacent channel region proximate the source S and drain D. Thus, the fuse device 30 is indirectly programmed, rather than being directly programmed. As an analogy, the gate G overlying the channel region is used as a heater to indirectly heat the underlying channel region to create the short between the source S and drain D. It takes less energy, e.g., less current, to heat the gate G than it would to directly heat the source and drain. For example, the fuse device 30 may be programmed with 1 mA of current or less. According to embodiments of the present invention, the programming current does not actually flow between the source S and the drain D.

Because a lower amount of current, and also voltage, are required to program embodiments of the programmable fuse device, the circuits may be made smaller than prior art two-terminal fuse circuits, and thus may occupy a smaller amount of area. The reduced chip area results in improved yields, because the statistical probability of defects is lower for a smaller-chip area circuit.

The programmable fuse device 30 may be implemented in low power circuits (that use batteries for a power source, for example), and other applications that run at low voltages, such as wireless circuits, because the fuse device may be programmed at a low current and low voltage.

Programming is enhanced by the fact that rather than changing the resistance, as in prior art two terminal fuses, the characteristics of a FET are changed. Rather than disrupting polysilicon as in prior art fuses, the characteristics of the junctions of a transistor are altered to program the fuse device 30.

The fuse device 30 may be programmed by the manufacturer or by a purchaser of the semiconductor device, for example. Preferably the fuse device 30 is electrically programmable, meaning that it may be programmed by applying electrical signals, rather than using a laser to program it.

Although embodiments of the present invention and some advantages thereof have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that the voltages, materials and material thicknesses described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a programmable electronic device, comprising the steps of:

providing a transistor, comprising a source, drain, a channel extending between said source and drain and a gate, the source and drain comprising semiconductor material heavily doped with a first dopant within a workpiece, and the gate having a first end, a second end and a region of conductive material disposed between said first end and said second end;

coupling a first gate contact to the first end of the gate;

coupling a second gate contact to the second end of the gate, such that a selected current passing from the first gate contact through the region of conductive material to the second gate contact will heat the gate and the channel extending between said source and drain to cause outdiffusion of the first dopant from the source and drain into said chancel to permanently alter said channel by forming a conductive region or short between said source and drain; and determining whether a current flows from the source to the drain in the absence of a voltage potential applied to the gate.

2. The method according to claim 1, further comprising:

forming a well region within the workpiece, wherein the transistor source and drain are formed within the well region.

3. The method according to claim 2, further comprising:

coupling a source contact to the source;

coupling a drain contact to the drain; and coupling a substrate contact to the well region.

4. The method according to claim 1, further comprising:

forming doped extensions and/or halos, the extensions and/or halos being part of the source and/or drain.

5. A method of programming a electronic device comprising a transistor, the transistor including a source, a drain, a channel extending between said source and drain and a gate, the gate having a first and second end and a conductive region between said first end and said second end, the gate being disposed to control the source and drain, and the source and drain comprising semiconductor material heavily doped with a first dopant within a workpiece, the method comprising the steps of:

generating a current to flow from the first end of the gate through said conductive region to the second end of the gate to heat the gate and said channel to cause source and drain dopant to differ from said source and drain into said channel to permanently form a conductive region or short between said source and drain; and determining whether current flows between the source and drain in the absence of a voltage potential applied to the gate.

6. The programming method according to claim 5, wherein the gate heat causes the channel to reach a temperature of around 800 to 1000° C.

7. The programming method according to claim 5, wherein the transistor source and/or drain comprise doped extensions and/or halos, and wherein heating the gate causes the outdiffusion of dopants into the workpiece from the extensions and/or halos of the source and drain.

8. A method of manufacturing a programmable electronic device comprising the steps of:

providing a transistor including a source, drain and gate, the source and drain comprising semiconductor material heavily doped with a first dopant, the gate comprising a first end and a second end and defining a conductive region between said first end and said second end;

coupling a first gate contact to the gate first end; coupling a second gate contact to the gate second end;

providing a current generating circuit with a first output coupled to the first gate contact and a second output coupled to the second gate contact such that a selected current from the current generating circuit passing from the first gate contact through the conductive region to the second gate contact will heat the gate and the channel defined between the source and drain, and such that dopants diffuse from the source and drain and into said channel to permanently form a conductive region between said source and drain; and determining whether current flows between the source and drain both with and without a voltage potential applied to the gate.

9. The method of claim 8, wherein the source and/or drain comprise doped extensions and/or halos, and wherein the outdiffusion of dopants is from the extensions and/or halos of the source and drain.

10. A method of manufacturing a programmable electronic device comprising the steps of:

providing a transistor including a source, a drain, a channel between said source and drain, a semiconductor well region and gate, the source and drain comprising semiconductor material heavily doped with a first dopant and formed within the well region, the well region doped with a second dopant, and the gate comprising a first end and a second end and a conductive region between said first end and said second end;

coupling a first gate contact to the gate first end; coupling a second gate contact to the gate second end; and providing a current generating circuit with a first output coupled to the first gate contact and a second output coupled to the second gate contact, such that current is passed from the first gate contact through the conductive region to the second gate contact heats the gate and the channel defined between the source and drain, and such that the first dopant outdiffuses from the source and drain into the well region, compensating for the second dopant, and wherein a region of conductive material is permanently formed within the well region between the source and drain; and Determining whether current flows between the source and drain in the absence of a voltage potential applied to the gate.

11. The method of claim 10, further comprising the steps of:

coupling a source contact to the source;

coupling a drain contact to the drain; and coupling a substrate contact to the well region.

12. The method of claim 10, wherein the transistor comprises a PFET, the first dopant comprises p+ type material and the second dopant comprises n type material.

13. The method of claim 12, wherein the first dopant comprises boron and the second dopant comprises arsenic or phosphorus.

14. The method of claim 10, wherein the transistor comprises an NFET, the first dopant comprises n+ type material and the second dopant comprises p type material.

15. The method of claim 14, wherein the first dopant comprises arsenic or phosphorus and the second dopant comprises boron.

16. A method of fabricating a programmable electronic device, comprising the steps of:

providing a workpiece;

forming a source region within the workpiece, the source region being doped with a first dopant material;

forming a drain region within the workpiece, the drain region being doped with the first dopant material and said source region and said drain region being spaced to form a channel therebetween;

forming a gate dielectric over a channel region that is adjacent the source region and drain region and over said channel;

forming a gate over the gate dielectric, the gate including a first contact at a first end and a second contact at a second end and a conductive material therebetween;

coupling a first supply node to the first end of the gate, the first supply node carrying a first voltage potential; and coupling a second supply node to the second end of the gate, the second supply node carrying a second voltage potential different from the first voltage potential during a programming mode, wherein the programmable electronic device is programmed by heating the gate and said drain region by applying the first and second voltage potential to the first and second supply nodes, respectively, and wherein the heated gate indirectly heats the channel region, causing the source region and drain region to outdiffuse the first dopant material from the source and drain regions into the channel region to permanently form a conductive region or short source regions and said drain region; and determining whether current will flow between the source and drain with or without the application of a voltage potential to the transistor gate.

17. The method of claim 16, further comprising the steps of:

coupling a source contact to the source;

coupling a drain contact to the drain; and coupling a substrate contact to the well region.

18. The method of claim 16, wherein the electronic device comprises a PFET, the first dopant comprises p+ type material and the second dopant comprises n type material.

* * * * *

UNITED STATES PATENT AND TRADEMARK OFFICE
CERTIFICATE OF CORRECTION

PATENT NO. : 6,913,954 B2 Page 1 of 1
DATED : July 5, 2005
INVENTOR(S) : Kothandaraman It is certified that error appears in the above-identified patent and that said Letters Patent is hereby corrected as shown below:

Column 12,
Line 31, insert -- a -- between "source," and "drain".
Line 46, delete "chancel" and insert -- channel --.

Column 13,
Line 53, insert -- a -- between "and" and "gate".

Signed and Sealed this

Twenty-seventh Day of September, 2005

JON W. DUDAS
*Director of the United States Patent and Trademark Office*